(12) United States Patent
Chipman et al.

(10) Patent No.: US 6,583,428 B1
(45) Date of Patent: Jun. 24, 2003

(54) APPARATUS FOR THE BACKSIDE GAS COOLING OF A WAFER IN A BATCH ION IMPLANTATION SYSTEM

(75) Inventors: David J. Chipman, Lynn, MA (US); Bryan C. Lagos, Danvers, MA (US); Robert J. Mitchell, Winchester, MA (US); Gary Rosen, Boston, MA (US); Dale K. Stone, Lynnfield, MA (US)

(73) Assignee: Axcelis Technologies, Inc., Beverly, MA (US)

(*) Notice: Subject to any disclaimer, the term of this patent is extended or adjusted under 35 U.S.C. 154(b) by 373 days.

(21) Appl. No.: 09/670,241

(22) Filed: Sep. 26, 2000

(51) Int. Cl.[7] .................................................. H01J 37/17
(52) U.S. Cl. ...................................... 250/492.21; 165/1
(58) Field of Search ................................ 250/292, 492.1, 250/492.2, 492.3, 492.21, 443.1, 442.1, 233, 453.1; 277/80, 410; 374/126

(56) References Cited

U.S. PATENT DOCUMENTS

| | | | |
|---|---|---|---|
| 4,419,584 A | 12/1983 | Benveniste | 250/492.2 |
| 4,567,938 A * | 2/1986 | Turner | 165/80.1 |
| 4,605,233 A | 8/1986 | Sato | 277/80 |
| 4,733,091 A * | 3/1988 | Robinson et al. | 277/410 |
| 4,899,059 A | 2/1990 | Freytsis et al. | 250/492.2 |
| 4,965,862 A | 10/1990 | Freytsis et al. | 250/453.1 |
| 5,238,499 A | 8/1993 | van de Ven et al. | |
| 5,389,793 A | 2/1995 | Aitken et al. | |
| 5,641,969 A * | 6/1997 | Cooke et al. | 240/492.21 |
| 5,954,342 A | 9/1999 | Mikhalev et al. | 277/410 |
| 6,222,196 B1 * | 4/2001 | Mack | 277/410 |
| 6,412,289 B1 | 7/2002 | Laskaris et al. | |

* cited by examiner

Primary Examiner—John R. Lee
Assistant Examiner—Christopher M. Kalivoda
(74) Attorney, Agent, or Firm—Eschweiler & Associates, LLC

(57) ABSTRACT

The invention provides apparatus by which a cooling gas is supplied from a stationary source to the back side of batch ion implanter workpieces being implanted in a rotating or spinning batch implanter process disk. The cooling gas provides improved heat transfer from the workpieces to the process disk, which may be advantageously combined with circulation of cooling fluid through passages in the process disk to remove heat therefrom. The invention further includes a rotary feedthrough employed to transfer the cooling gas from a stationary housing to a gas chamber in a rotating shaft which spins the batch implanter process disk. In addition, a seal apparatus is provided which seals the cooling gas applied to the back sides of the workpieces from the vacuum in which the front sides of the workpieces are implanted.

21 Claims, 13 Drawing Sheets

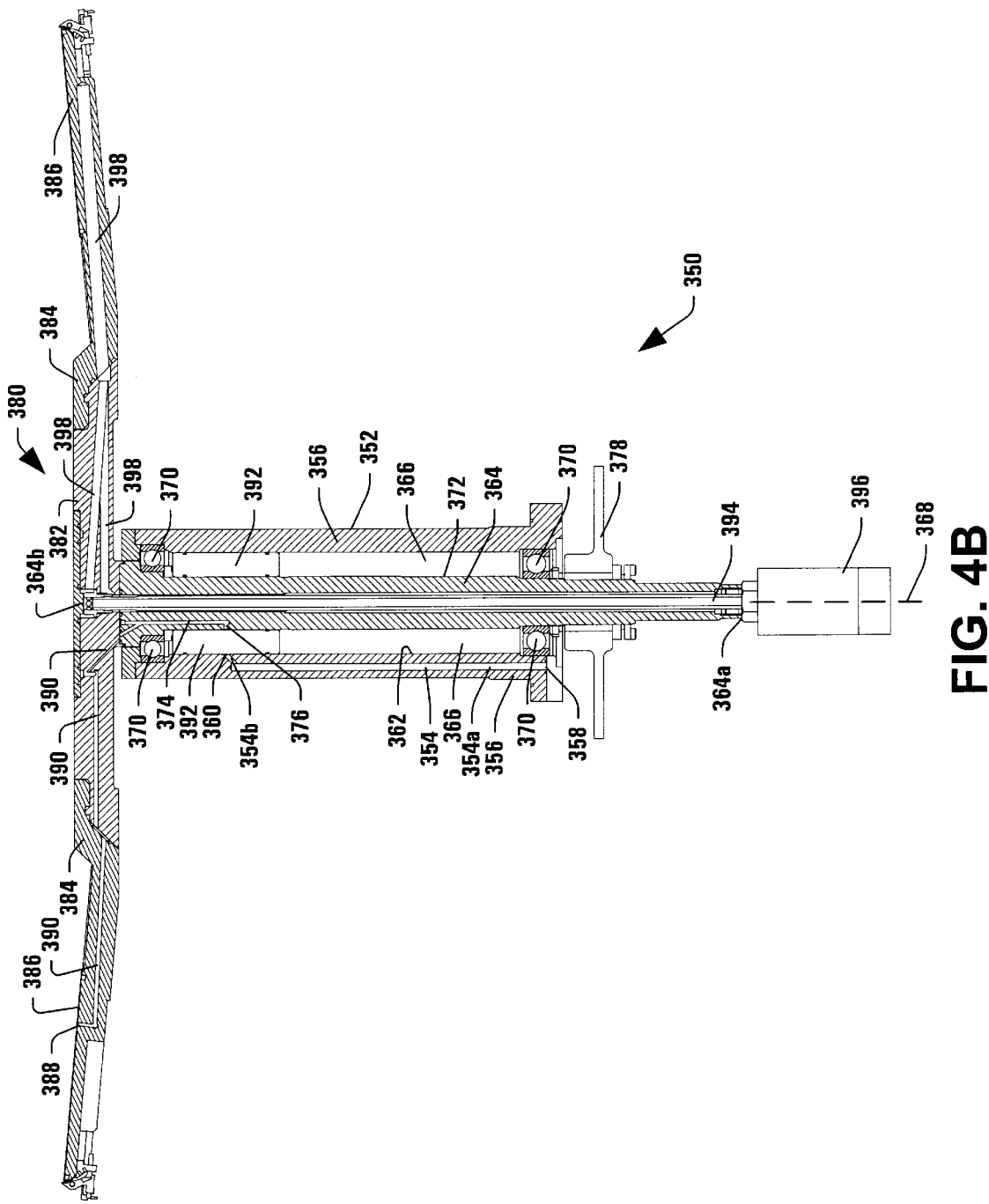

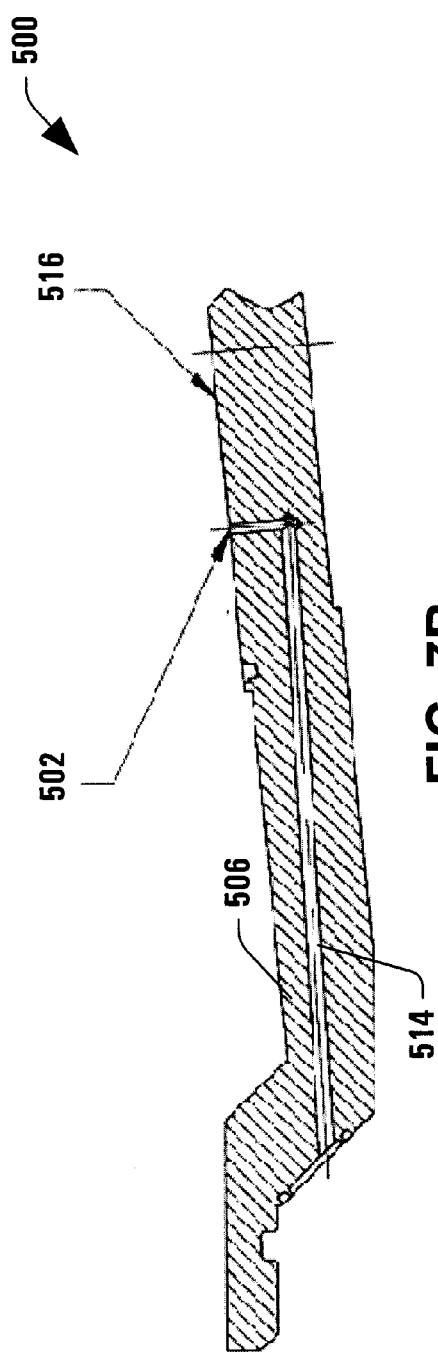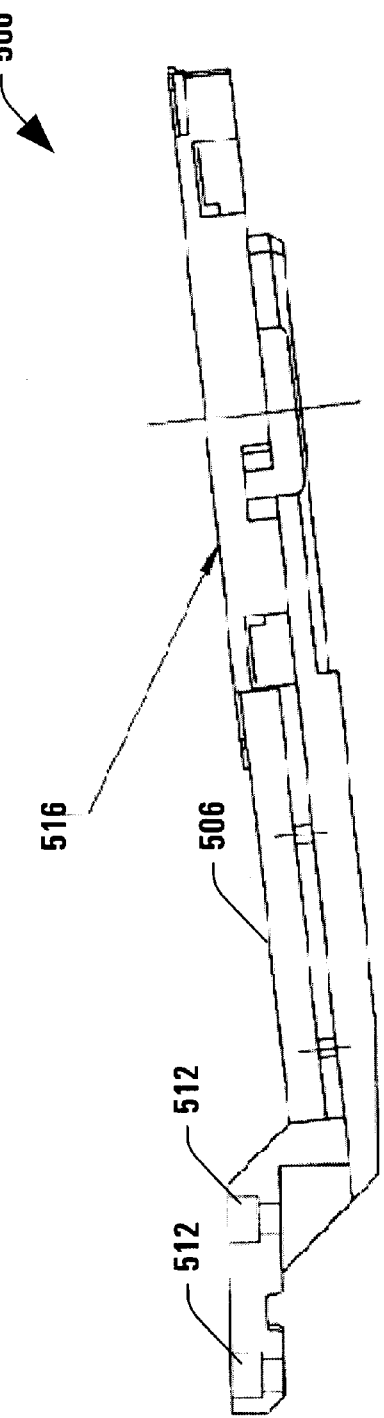

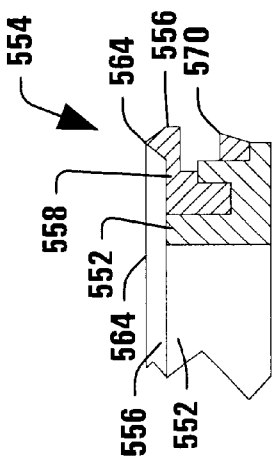
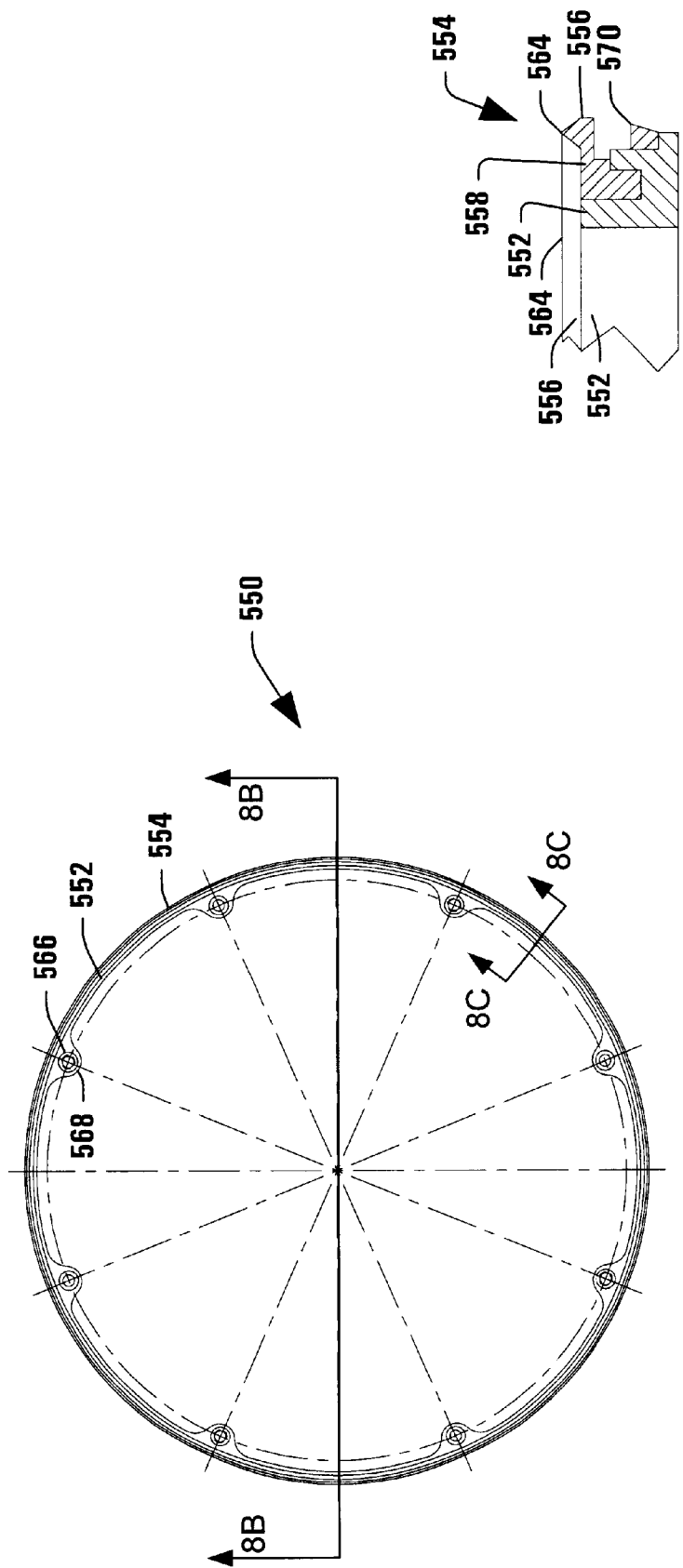
FIG. 8C
FIG. 8A

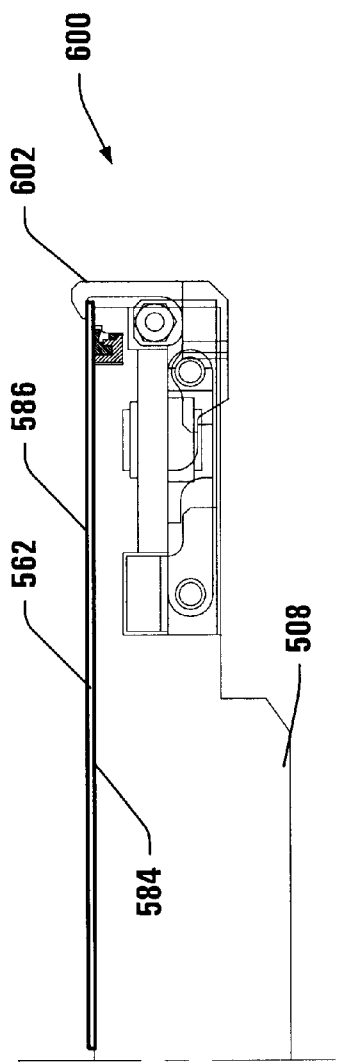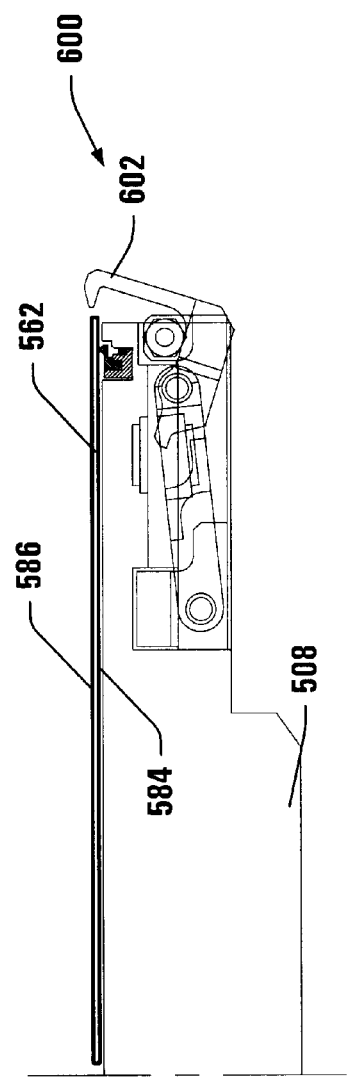

APPARATUS FOR THE BACKSIDE GAS COOLING OF A WAFER IN A BATCH ION IMPLANTATION SYSTEM

FIELD OF THE INVENTION

The present invention relates generally to batch ion implantation systems, and more particularly to an apparatus for the backside cooling of a wafer in a batch ion implanter and a seal apparatus therefor.

BACKGROUND OF THE INVENTION

In the manufacture of semiconductor devices, ion implantation is used to dope semiconductors with impurities. Ion beam implanters are used to treat silicon wafers with an ion beam, in order to produce n or p type extrinsic material doping or to form passivation layers during fabrication of an integrated circuit. When used for doping semiconductors, the ion beam implanter injects a selected ion species to produce the desired extrinsic material. Implanting ions generated from source materials such as antimony, arsenic or phosphorus results in "n type" extrinsic material wafers, whereas if "p type" extrinsic material wafers are desired, ions generated with source materials such as boron, gallium or indium may be implanted.

Typical ion beam implanters include an ion source for generating positively charged ions from ionizable source materials. The generated ions are formed into a beam and directed along a predetermined beam path to an implantation station. The ion beam implanter may include beam forming and shaping structures extending between the ion source and the implantation station. The beam forming and shaping structures maintain the ion beam and bound an elongated interior cavity or passageway through which the beam passes en route to the implantation station. When operating an implanter, this passageway must be evacuated to reduce the probability of ions being deflected from the predetermined beam path as a result of collisions with air molecules.

The mass of an ion relative to the charge thereon (e.g., charge-to-mass ratio) affects the degree to which it is accelerated both axially and transversely by an electrostatic or magnetic field. Therefore, the beam which reaches a desired area of a semiconductor wafer or other target can be made very pure since ions of undesirable molecular weight will be deflected to positions away from the beam and implantation of other than desired materials can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway which will effectively separate ions of different charge-to-mass ratios.

Ion implanters may be separated into two different categories. The first category includes serial ion implanters, in which semiconductor wafers or other workpieces are completely implanted with ions in serial fashion. This type of implanter includes a single workpiece mount adapted to hold or support the workpiece being implanted. The second category of ion implanters includes batch implanters, wherein a plurality of wafers or other workpieces may be implanted with ions in a single batch. The workpieces being implanted are mounted in individual workpiece mounts in a rotatable process disk. The workpiece mounts are typically located on individual pedestals extending outward from a center portion of the process disk at a slight angle so as to use centrifugal force to keep the workpieces seated in the mounts as the process disk is rotated in a controlled fashion via a drive motor. The ion source is located so as to present ions along a beam path offset from the rotational axis of the process disk, and thereby to implant ions onto the workpieces as they rotate into the beam path. This method of ion implantation is sometimes referred to as spinning disk ion implantation.

As ions are implanted in the workpieces, heat is generated therein, which may cause workpiece damage or other deleterious effects if not removed from the workpiece. Conventional batch ion implantation systems and apparatus remove heat from the process disk onto which the workpieces are mounted, using internal passages through which cooling fluid such as water is circulated. Heat is removed from the workpieces to the process disk through vulcanized rubber or RTV pads on which the workpieces are seated. The RTV pads provide some heat removal by transferring heat from the workpieces to the process disk. However, improved heat transfer is desirable, in order to minimize thermal damage to the workpieces. In addition, the relatively sticky RTV presently employed for heat sinking may cause other problems. In particular, the workpieces may stick to the RTV, making removal of the workpieces from the batch implanter difficult. Furthermore, particles tend to adhere to the RTV, which may be transferred to the workpieces causing undesirable contamination thereof. Moreover, the RTV pads may cause capacitive charging of the workpieces. Thus, there is an unresolved need for improved batch ion implantation systems and apparatus which eliminate or minimize the problems associated with conventional RTV workpiece heat sink pads, and which provide for improved heat transfer away from the workpieces.

SUMMARY OF THE INVENTION

The present invention is directed to a system and apparatus which provides improved heat transfer from workpieces in a batch ion implantation operation, while eliminating RTV pads heretofore employed and the problems associated therewith. The invention provides an apparatus by which a cooling gas is supplied from a stationary source to the back side of the workpieces being implanted in a rotating or spinning batch implanter process disk. The provision of the cooling gas allows for improved heat transfer from the workpieces to the process disk, which may be advantageously combined with circulation of cooling fluid through passages in the process disk to remove heat therefrom. The invention further includes the use of a rotary feedthrough in order to transfer the cooling gas from a stationary housing to a gas chamber in a rotating shaft which spins the batch implanter process disk. In addition, a seal apparatus is provided which seals the cooling gas applied to the back sides of the workpieces from the vacuum in which the front sides of the workpieces are implanted. The invention thus improves heat transfer and reduces or eliminates particulate transfer, wafer sticking, and wafer capacitive charging associated with conventional batch implanters.

In accordance with one aspect of the present invention, there is provided an ion implantation system comprising a housing with an outer wall having an outer surface and an inner surface defining an interior cavity, and a first gas chamber extending through the outer wall between a first gas inlet opening in the outer surface of the outer wall and an outlet opening in the inner surface. A shaft is rotatably mounted in the interior cavity of the housing for rotation about an axis, which includes an outer surface extending axially between a first end and a second end. The shaft includes a second gas chamber extending there through between a second gas inlet opening through the outer surface of the shaft and the second end thereof. A process disk is mounted onto or otherwise operatively engaged with the second end of the shaft for rotation about the axis, including a third gas chamber in fluid communication with the second gas chamber of the shaft.

The process disk comprises one or more pedestals extending laterally outwardly from a center portion, wherein the pedestals may each include a workpiece mount radially disposed from the axis and adapted to support a workpiece thereon. The pedestals comprise a gas feed port in the corresponding workpiece mount, wherein the third gas chamber provides fluid communication between the second gas chamber in the shaft and the gas feed ports in the workpiece mounts. The system may further comprise a drive, such as a motor, adapted to provide rotation of the shaft with respect to the housing, and a cooling gas source adapted to provide gas to the gas inlet opening in the housing, whereby cooling gas may be provided to the back sides of the workpieces via the first, second, and third gas chambers in order to remove heat from the workpieces as ions are implanted thereon.

A rotary feedthrough is included in the system providing fluid communication between the outlet opening of the housing and the second gas inlet of the shaft. This feedthrough may comprise, for example, a magnetic seal adapted to provide a seal between the interior cavity of the housing and the first and second gas chambers. In this regard, the magnetic seal may comprise a cylindrical member having an inner surface disposed radially outwardly of and encircling the shaft to form a gap there between, an outer surface mounted on the inner surface of the housing, a magnet forming a magnetic circuit with the shaft, and a magnetic fluid filling a portion of the gap between the cylindrical member inner surface and the shaft, wherein the magnetic fluid provides the seal between the interior cavity of the housing and the first and second gas chambers. Thus configured, cooling gas may be provided from the cooling gas source to the workpiece at the gas feed port of the workpiece mount via the first, second, and third gas chambers in order to remove heat from the workpiece.

In application with an ion implanter which operates in a vacuum, the magnetic seal thus provides a seal between the vacuum and the cooling gas, as well as between the cooling gas (which may be pressurized), and the ambient. This dual seal arrangement facilitates the application of pressurized cooling gas to the back sides of the spinning wafer workpieces in a batch ion implanter which is free of impurities. In this regard, the interior cavity of the stationary housing may comprise a first cavity end proximate the first end of the shaft and a second cavity end disposed near the second end of the shaft, wherein the first cavity end may be at ambient pressure, and the second cavity end may be in the evacuated implantation process chamber. Accordingly, the cylindrical feedthrough member extends axially between a first end disposed toward the first end of the shaft and a second end disposed toward the second end of the shaft. The rotary feedthrough may further comprise a first seal portion near the first end of the cylindrical member and providing a seal between the first cavity end (e.g., ambient pressure) and the first and second gas chambers (e.g., pressurized cooling gas), and a second seal portion near the second end of the cylindrical member and providing a seal between the second cavity end (e.g., vacuum) and the first and second gas chambers (e.g., cooling gas).

In a dual seal magnetic feedthrough, for example, the first seal portion of the cylindrical member may comprise a first inner surface disposed radially outwardly of and encircling the shaft to form a first gap there between, which is axially disposed between the first end of the cylindrical member and the first and second gas chambers, and a first outer surface mounted on the inner surface of the housing. A first magnet forms a first magnetic circuit with the shaft, and a first magnetic fluid fills a portion of the first gap between the cylindrical member inner surface and the shaft. Thus configured, the first magnetic fluid provides a reliable seal between the first cavity end and the first and second gas chambers (e.g., between the ambient and the cooling gas) which prevents escape of the cooling gas to the ambient environment, or of ambient gas to the cooling gas, and introduction of impurities into the cooling gas.

Similarly, the second seal portion may comprise a second inner surface disposed radially outwardly of and encircling the shaft to form a second gap there between, the second gap being axially disposed between the second end of the cylindrical member and the first and second gas chambers, and a second outer surface mounted on the inner surface of the housing. A second magnet forms a second magnetic circuit with the shaft, and a second magnetic fluid fills a portion of the second gap between the cylindrical member inner surface and the shaft. The second magnetic fluid thus provides a seal between the second cavity end and the first and second gas chambers (e.g., between the cooling gas and the vacuum).

According to another aspect of the invention, a workpiece support is provided for supporting at least one workpiece in a batch ion implantation system. The support comprises a housing with an outer wall having an outer surface and an inner surface defining an interior cavity, and a first gas chamber extending through the outer wall between a first gas inlet opening in the outer surface of the outer wall and an outlet opening in the inner surface, and a shaft rotatably mounted in the interior cavity of the housing for rotation about an axis and having an outer surface extending axially between a first end and a second end. The shaft includes a second gas chamber extending there through between a second gas inlet opening through the outer surface of the shaft and the second end. A drive may be included for providing rotation of the shaft with respect to the housing in order to effectuate spinning disk implantation in the batch implanter.

A process disk is mounted on the second end of the shaft for rotation about the axis, and includes a center portion located along the axis and one or more pedestals extending laterally outwardly from the center portion. The pedestals comprise a workpiece mount radially disposed from the axis and adapted to support a workpiece thereon, which in turn includes a gas feed port. The process disk further comprises a third gas chamber providing fluid communication between the second gas chamber in the shaft and the gas feed ports of the workpiece mounts. The workpiece support further includes a rotary feedthrough providing fluid communication between the outlet opening of the housing and the second gas inlet of the shaft, which may include a magnetic seal. The rotary feedthrough may advantageously provide first and second seals between the gas chambers and first and second ends of the housing cavity, whereby cooling gas passing there through is sealed from the outside ambient pressure as well as from the vacuum chamber in which the front surfaces of the workpieces are implanted with ions.

According to yet another aspect of the invention, there is provided a seal apparatus for sealing a front side of a wafer from cooling gas supplied to the back side thereof. The seal may be employed in a batch ion implanter with a rotatable process disk having at least one workpiece mount adapted to support the workpiece and to supply a cooling gas to the workpiece back side. The seal apparatus comprises a ring-shaped support member mounted on the workpiece mount, and a first seal member mounted on the support member having a first portion flexible with respect to the support member and adapted to engage a portion of the backside of the workpiece proximate the peripheral edge to seal the front side of the workpiece from the cooling gas.

The first portion of the first seal member may be flexible in a direction generally perpendicular to the plane of the workpiece. This allows the centrifugal force resulting from rotation of the workpiece in the process disk to deflect the first seal member around the peripheral edge of the workpiece to provide sealing engagement there between. Alternatively or in combination, a mechanical clamping arrangement may be used to provide flexure of the first seal member to effectuate a sealing engagement with a peripheral surface of the workpiece. The first portion of the first seal member may also be cantilevered radially outwardly with respect to the center of the ring-shaped support member so as to pivot about a circumferential axis in a direction generally perpendicular to the plane of the workpiece.

In addition, the first portion of the first seal member may include a rib extending toward and engaging the backside of the workpiece proximate the peripheral edge, which may have a v-shaped profile with a pointed edge extending toward and engaging the backside of the workpiece proximate the peripheral edge. The ring-shaped support member may be detachable from the workpiece mount allowing replacement thereof in the implanter, and the seal apparatus may further include a second seal member mounted on the support member with a radially outwardly extending rib adapted to engage a sidewall of the workpiece mount to provide a seal between the support member and the workpiece mount sidewall.

In accordance with still another aspect of the invention, there is provided a seal apparatus comprising a ring-shaped support member mounted on the workpiece mount, a first seal member mounted on the support member having a first seal portion flexible with respect to the support member and adapted to engage a portion of the backside of the workpiece proximate the peripheral edge to seal the front side of the workpiece from the cooling gas, and a second seal member mounted on the support member and having a radially outwardly extending rib adapted to engage a sidewall or surface of the workpiece mount to provide a seal between the support member and the workpiece mount sidewall.

According to another aspect of the invention, there is provided a batch ion implanter process disk pedestal for supporting a workpiece having a peripheral edge on a rotatable process disk. The pedestal comprises a workpiece mount adapted to support the workpiece in a plane, a gas feed port adapted to supply a cooling gas to a back side of the workpiece, a ring-shaped support member mounted on the workpiece mount, and a first seal member mounted on the support member having a first portion flexible with respect to the support member and adapted to engage a portion of the backside of the workpiece proximate the peripheral edge to seal the front side of the workpiece from the cooling gas. The ring-shaped support member may be detachable from the workpiece mount allowing replacement thereof in the pedestal.

The pedestal may further include a second seal member mounted on the support member and having a radially outwardly extending rib adapted to engage a sidewall or surface of the workpiece mount to provide a seal between the support member and the workpiece mount sidewall. The first portion of the first seal member may be flexible in a direction generally perpendicular to the plane of the workpiece, and cantilevered radially outwardly with respect to the center of the ring-shaped support member so as to pivot about a circumferential axis in a direction generally perpendicular to the plane of the workpiece.

To the accomplishment of the foregoing and related ends, the invention comprises the features hereinafter fully described and particularly pointed out in the claims. The following description and the annexed drawings set forth in detail certain illustrative aspects of the invention. These aspects are indicative, however, of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 4B is another sectional side elevation view illustrating the batch implanter workpiece support of FIG. 4A;

FIG. 7A is a partial side elevation view illustrating the exemplary wafer pedestal of FIG. 6;

FIG. 7B is a partial side elevation view in section illustrating the exemplary wafer pedestal of FIGS. 6 and 7A;

FIG. 8A is a top plan view illustrating an exemplary ring seal in accordance with another aspect of the invention;

FIG. 8C is another sectional side elevation view illustrating the ring seal taken along line 8C—8C of FIG. 8A;

FIG. 9A is a sectional side elevation view illustrating an exemplary wafer clamp in a closed or clamped position; and FIG. 9B is a sectional side elevation view illustrating the wafer clamp of FIG. 9A in an open position.

DETAILED DESCRIPTION OF THE INVENTION

Figure 1A:
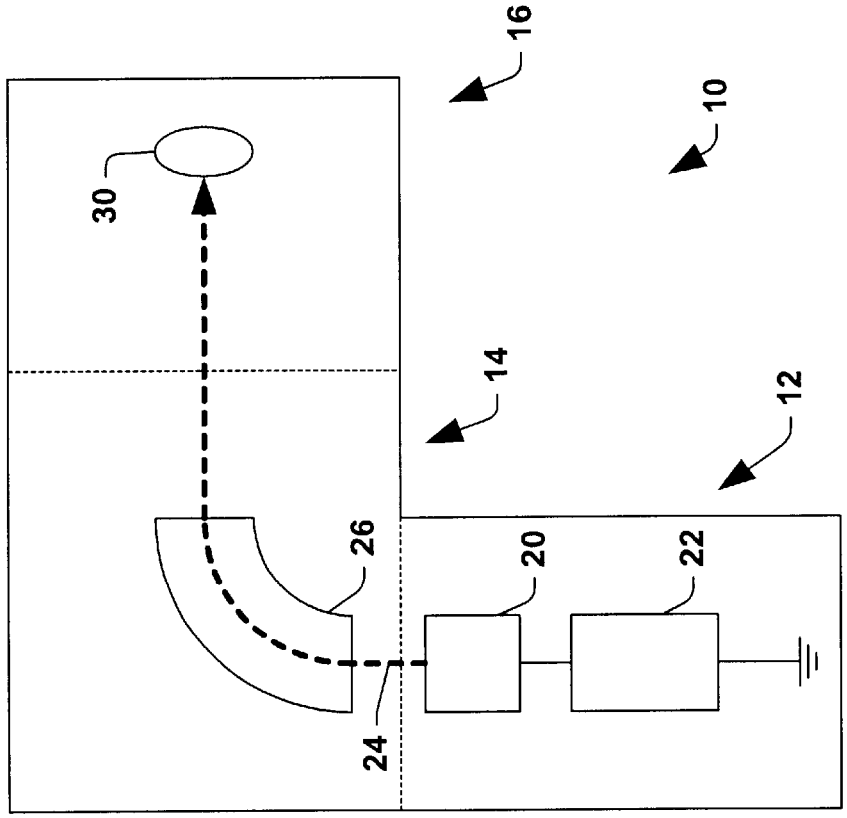
FIG. 1A is a schematic block diagram illustrating an ion implantation system in which the present invention may be employed.

The present invention will now be described with reference to the drawings wherein like reference numerals are used to refer to like elements throughout. The invention provides an apparatus by which a cooling gas is supplied from a stationary pressurized gas source to the back side of batch ion implanter workpieces being implanted in a rotating or spinning batch implanter process disk. The cooling gas provides improved heat transfer from the workpieces to the process disk, which may be advantageously combined with circulation of a cooling fluid through passages in the process disk to remove the transferred heat therefrom. The invention further includes a rotary feedthrough employed to transfer the cooling gas from a stationary housing to a gas chamber in a rotating shaft which spins the batch implanter process disk. In addition, a seal apparatus is provided which seals the cooling gas applied to the back sides of the workpieces from the vacuum in which the front sides of the workpieces are implanted. The invention thus improves heat transfer and reduces or eliminates particulate transfer, wafer sticking, and wafer capacitive charging associated with conventional batch implanters.

Referring now to the drawings, FIG. 1A illustrates an exemplary ion implanter 10, which may be employed in the batch implantation of one or more workpieces. The implanter 10 comprises a terminal 12, a beamline assembly 14, and an end station 16. The terminal 12 includes an ion source 20 powered by a high voltage power supply 22. The ion source 20 produces an ion beam 24 which is provided to the beamline assembly 14. The ion beam 24 is conditioned by a mass analysis magnet 26. The mass analysis magnet 26 passes only ions of appropriate charge-to-mass ratio to a target 30 which may include a rotating process disk (not shown) having one or more semiconductor wafers or other workpieces (not shown) mounted thereon for implantation with ions from the ion beam 24. The conditioned ion beam 24 is thus directed toward the target 30 in the end station 16.

Figure 1B:
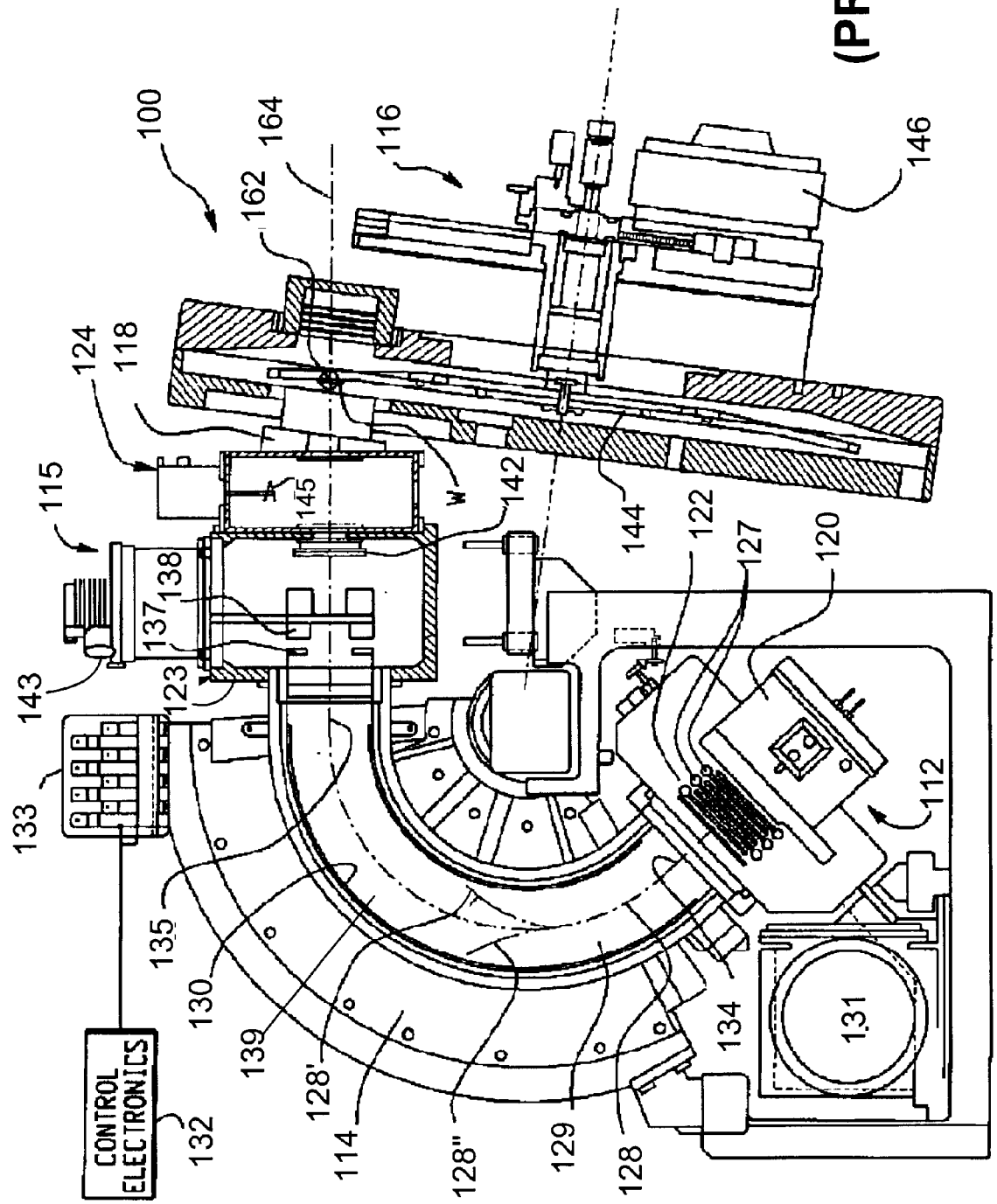
FIG. 1B is a side elevation view partially in section illustrating an ion implanter for ion beam treatment of a workpiece.

Referring also to FIG. 1B, another exemplary batch ion implanter 100 is illustrated, in which one or more aspects of the present invention may be advantageously employed. Implanter 100 comprises an ion source 112, a mass analysis magnet 114, a beamline assembly 115, and a target or end station 116. An expansible stainless steel bellows assembly 118, which permits movement of the end station 116 with respect to the beamline assembly 115, connects the end station 116 and the beamline assembly 115. The ion source 112 comprises a plasma chamber 120 and an ion extractor assembly 122. Energy is imparted to an ionizable dopant gas to generate ions within the plasma chamber 120. Generally, positive ions are generated, although the present invention is applicable to systems wherein negative ions are generated by the source 112. The positive ions are extracted through a slit in the plasma chamber 120 by the ion extractor assembly 122, which comprises a plurality of electrodes 127. Accordingly, the ion extractor assembly 122 functions to extract a beam 128 of positive ions from the plasma chamber 120 and to accelerate the extracted ions into the mass analysis magnet 114.

The mass analysis magnet 114 functions to pass only ions of an appropriate charge-to-mass ratio to the beamline assembly 115, which comprises a resolver housing 123 and a beam neutralizer 124. The mass analysis magnet 114 includes a curved beam path 129 within a passageway 139 defined by an aluminum beam guide having side walls 130, evacuation of which is provided by a vacuum pump 131. The ion beam 128 that propagates along this path 129 is affected by the magnetic field generated by the mass analysis magnet 114, to reject ions of an inappropriate charge-to-mass ratio. The strength and orientation of this dipole magnetic field is controlled by control electronics 132 which adjust the electrical current through the field windings of the magnet 114 through a magnet connector 133. The dipole magnetic field causes the ion beam 128 to move along the curved beam path 129 from a first or entrance trajectory 134 near the ion source 112 to a second or exit trajectory 135 near the resolving housing 123. Portions 128' and 128" of the beam 128, comprised of ions having an inappropriate charge-to-mass ratio, are deflected away from the curved trajectory and into the walls of an aluminum beam guide 130. In this manner, the magnet 114 passes to the resolving housing 123 only those ions in the beam 128 which have the desired charge-to-mass ratio.

The resolver housing 123 includes a terminal electrode 137, an electrostatic lens 138 for focusing the ion beam 128, and a dosimetry indicator such as a Faraday flag 142. The beam neutralizer 124 includes a plasma shower 145 for neutralizing the positive charge that would otherwise accumulate on the target wafer as a result of being implanted by the positively charged ion beam 128. The beam neutralizer and resolver housings are evacuated by a vacuum pump 143. Downstream of the beam neutralizer 124 is the end station 116, which includes a disk-shaped workpiece support or process disk 144 upon which wafers to be implanted are mounted. The process disk 144 resides in a target plane which is generally perpendicularly oriented to the direction of the implant beam. The process disk 144 at the end station 116 is rotated by a motor 146. The ion beam thus strikes wafers mounted to the process disk as they move in a circular path. The end station 116 may be adapted to pivot about point 162, which is the intersection of the path 164 of the ion beam and the wafer W, so that the target plane is adjustable about this point.

Figure 2:
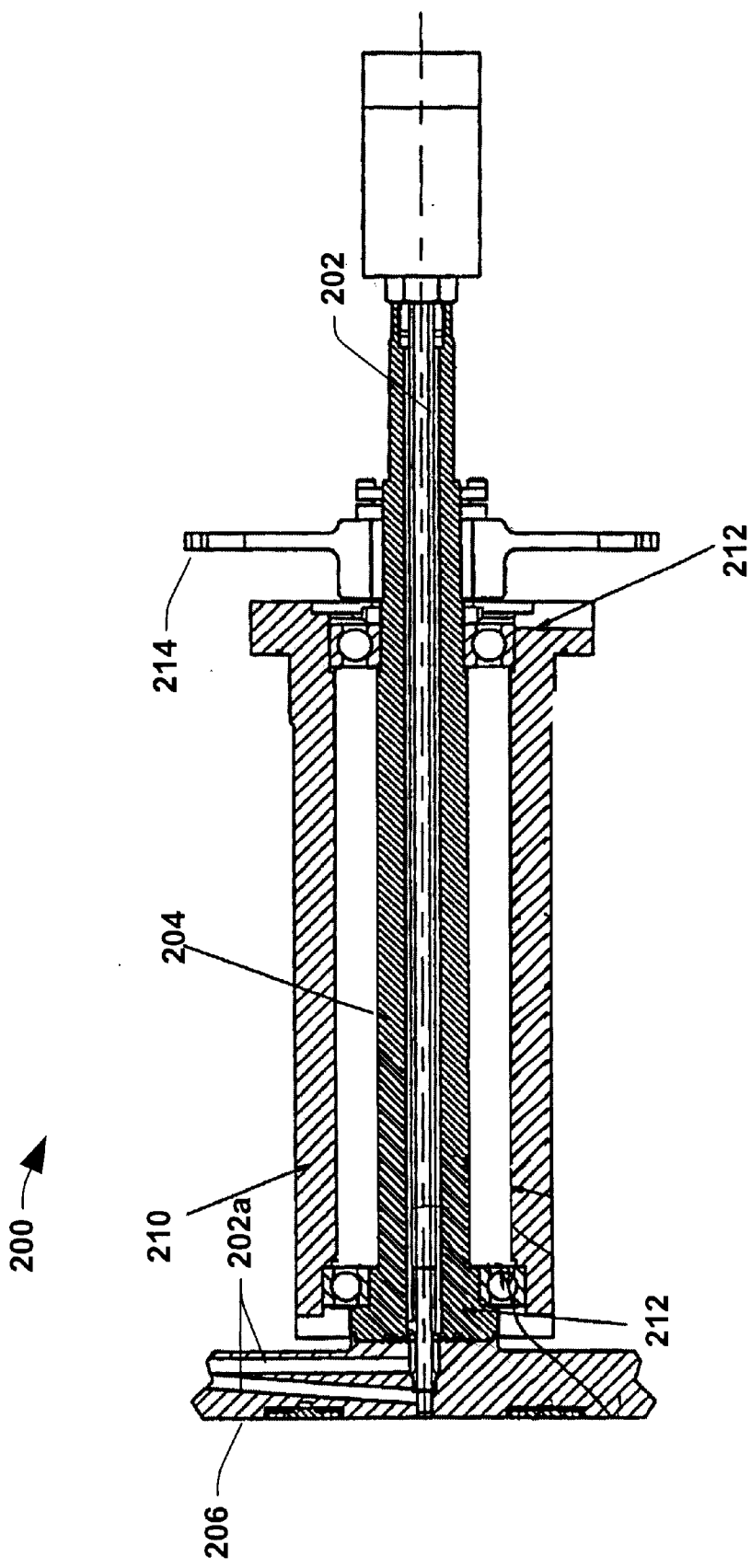
FIG. 2 is a sectional side elevation view illustrating a batch implanter spindle assembly having a cooling fluid passage in a rotating shaft.

In the course of implanting ions onto a wafer or other workpiece, heat is generated in the workpiece, which must be removed therefrom in order to prevent or minimize thermal damage to the workpiece. Referring now to FIG. 2, a batch implanter spindle assembly 200 is illustrated having a cooling fluid passage 202 in a rotating shaft 204, through which cooling fluid (e.g., water) is circulated to provide heat removal from a rotating process disk 206 via process disk circulation passages 202a located in the process disk 206. In conventional batch implantation systems, RTV has been used in workpiece mounts (not shown) to provide some level of thermal transfer between the workpieces (not shown) mounted therein and the process disk 206. The shaft 204 is rotatably mounted in a stationary housing 210 using bearings 212 for rotation via a motor or other drive component (not shown) via a drive gear 214. While the circulation of cooling fluid through passages 202, 202a in combination with the RTV pads in the workpiece mounts has heretofore achieved some level of heat sinking for removal of heat from workpieces, improved heat removal and the elimination of the problems associated with RTV are desirable.

Figure 3:
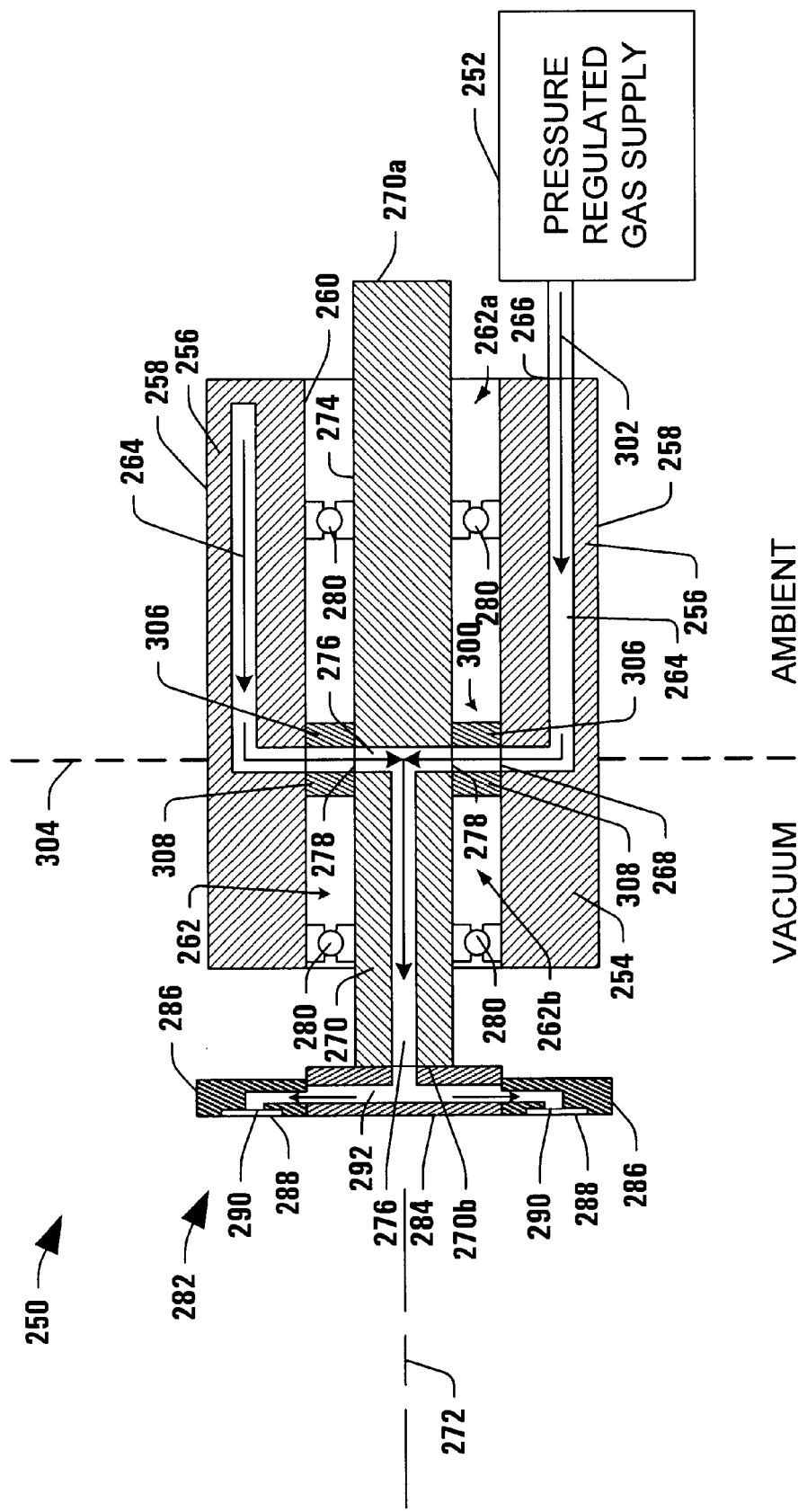
FIG. 3 is a sectional side elevation view illustrating an exemplary workpiece support spindle assembly having a gas chamber in a rotating shaft adapted for receiving cooling gas from a stationary gas supply through a rotational seal in accordance with an aspect of the present invention.

Referring now to FIG. 3, an exemplary batch implanter workpiece support spindle assembly 250 is illustrated in section, which is adapted to provide cooling gas from a stationary source 252 to the backside of one or more workpieces (not shown), in accordance with an aspect of the present invention. The assembly 250 may be employed in a batch ion implantation system having an ion source (not shown) for providing ions to a workpiece (not shown). The spindle assembly comprises a housing 254 with an outer wall 256 having an outer surface 258 and an inner surface 260 defining an interior cavity 262 with a first cavity end 262a and a second cavity end 262b. The housing 254 further comprises a first gas chamber 264 extending through the outer wall 256 between a first gas inlet opening 266 in the outer surface 258 of the outer wall 256 and an outlet opening 268 in the inner surface 260.

A shaft 270 is rotatably mounted in the interior cavity 262 of the housing 254 for rotation about an axis 272 with an outer surface 274 extending axially between a first end 270a and a second end 270b. Shaft 270 further comprises a second gas chamber 276 extending there through between a second gas inlet opening 278 through the outer surface 274 of the shaft 270 and the second end 270b thereof. A drive (not shown) may be engaged with first end 270a of the shaft 270 to provide rotation of the shaft 270 with respect to the housing 254 about axis 272. The shaft is supported in the cavity 262 of housing 254 using rotational bearings 280.

A process disk 282 is mounted on the second end 270b of the shaft 270 for rotation about the axis 272, and comprises a center portion 284 located along the axis 272 and one or more pedestals 286 extending laterally outwardly from the center portion 284. Pedestals 286 comprise a workpiece mount 288 radially disposed from the axis 272 and adapted to support a workpiece (not shown) thereon, such as a semiconductor wafer, as well as a gas feed port 290. The process disk 282 further comprises a third gas chamber 292 providing fluid communication between the second gas chamber 276 in the shaft 274 and the gas feed port 290 in the workpiece mounts 288.

The workpiece support spindle assembly 250 also comprises a rotary feedthrough 300 providing fluid communication between the outlet opening 268 in the inner surface 260 of the outer wall 256 of housing 254 and the second gas inlet opening 278 of the shaft 270. The provision of the rotary feedthrough 300 and the gas chambers 264, 276, and 292 enables provision of cooling gas 302 from the gas source 252 to the backside of the workpieces (not shown) mounted in the workpiece mounts 288 for spinning ion implantation, whereby improved heat removal therefrom is provided according to the invention. It will be noted at this point that the use of cooling gas to remove heat from the workpieces in the mounts 288 according to the invention, allows the elimination of the conventional RTV rubber pads heretofore used to provide heat sinking from the work pieces to the process disk 282. In this fashion, the deleterious effects of the RTV on the workpieces (e.g., sticking, particulate contamination, capacitive charging, and the like) may be eliminated or minimized, and the heat transfer from the workpieces improved. In addition, as illustrated and described hereinafter, the gas cooling may be employed in combination with fluid (water) cooling in order to further improve the heat transfer away from the workpieces being implanted with ions.

The rotary feedthrough 300 may comprise a magnetic seal adapted to provide a seal between the interior cavity 262 of the housing 254 and the first and second gas chambers 264 and 276. While other types of mechanical seals may be used, the magnetic type seal provides for a highly reliable vacuum seal as well as a high purity seal. Were impurities allowed to impinge on the cooling gas, these impurities could cause unacceptable contamination of the workpieces. Thus, the inventors have found that a magnetic seal provides an adequate pressure and impurity seal for the cooling gas to be applied to the workpieces.

Where the assembly 250 is employed in a batch ion implantation system, the ions may be implanted in a vacuum. The first cavity end 262a of the housing 254 may thus be at ambient pressure, whereas the second cavity end 262b may be in a vacuum. A corresponding pressure boundary 304 may thus be established between the vacuum and the ambient. In this regard, the rotary feedthrough 300 may comprise a first seal 306 disposed between the first and second gas chambers 264 and 276 and the first cavity end 262a, and a second seal 308 disposed between the first and second gas chambers 264 and 276 and the second cavity end 262b. Thus, where the first cavity end 262a is at ambient pressure and the second cavity end 262b is at vacuum, the rotary feedthrough 300 provides a dual seal, isolating the cooling gas flowing through the first, second, and third gas chambers 264, 276, and 292, respectively, from both the ambient and the vacuum in which ion implantation takes place.

Figure 4A:
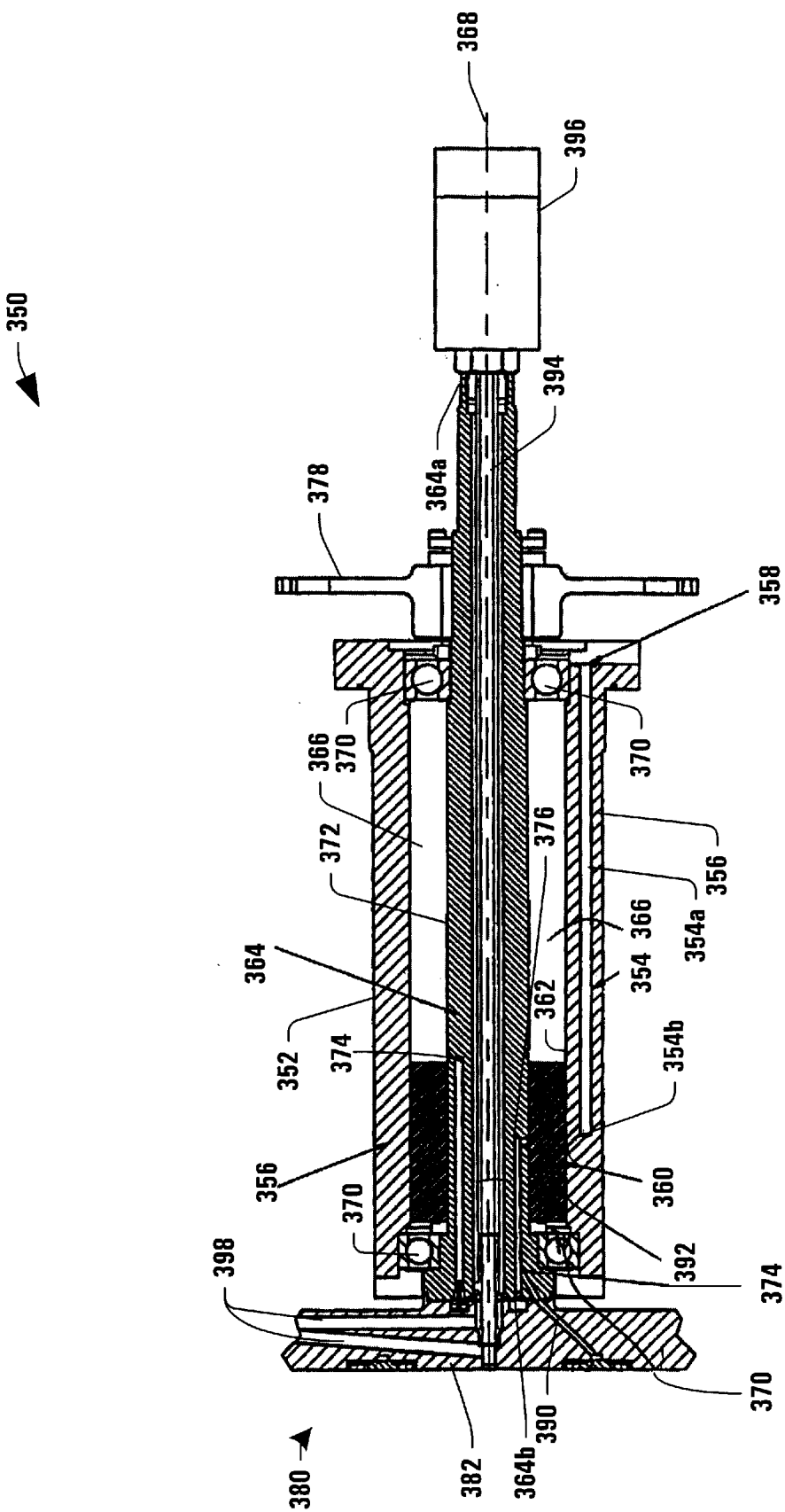
FIG. 4A is a sectional side elevation view illustrating another exemplary batch implanter workpiece support according to the invention.

Referring now to FIGS. 4A and 4B, another exemplary batch implanter workpiece support 350 is illustrated in section according to the invention, comprising a housing 352 with a first gas chamber 354 extending through an outer wall 356 of the housing 352 between a first gas inlet opening 358 and an outlet opening 360 through an inner surface 362 of the outer wall 356. The first gas chamber 354 comprises a first portion 354a extending longitudinally from the first gas inlet opening 358 to a second portion 354b extending at an angle from the first portion 354a to the outlet opening 360. A shaft 364 is rotatably mounted in an interior cavity 366 of the housing 352 for rotation about an axis 368 and supported in bearings 370. The shaft 364 comprises an outer surface 372 extending axially between a first end 364a and a second end 364b, and a second gas chamber 374 extending there through between a second gas inlet opening 376 through the outer surface 372 of the shaft and the second end 364b of the shaft 364. Shaft 364 may further include a motor rotor support 378 mounted near the first end 364a for interfacing with a drive motor (not shown) or attaching directly to a motor rotor.

A process disk 380 is mounted on the second end 364b of the shaft 364 for rotation about the axis 368, and has a center portion 382 located along the axis 368 and one or more pedestals 384 (FIG. 4B) extending laterally outwardly from the center portion 382. The pedestals 384 comprise workpiece mounts 386 radially disposed from the axis 368 and adapted to support a workpiece (not shown) thereon and include gas feed ports 388. The process disk 380 further includes a third gas chamber 390 providing fluid communication between the second gas chamber 374 in the shaft 364 and the gas feed ports 388 in the workpiece mounts 386.

A rotary feedthrough 392 is mounted between the housing 352 and the shaft 364, providing fluid communication between the outlet opening 360 of the housing 352 and the second gas inlet 376 of the shaft 364, thereby allowing cooling gas to circulate from the inlet opening 358 through the gas chambers 354, 374, and 390 to the backside of workpieces (not shown) mounted in the workpiece mounts 386. The shaft 364 may further include a fluid passage 394 adapted to provide cooling fluid (e.g., water) from an inlet 396 to fluid passages 398 in the process disk 382, whereby heat transferred from workpieces in the workpiece mounts 386 to the process disk 382 (e.g., via cooling gas circulated through gas chambers 354, 374, and 390 to the backside of workpieces mounted in the workpiece mounts 386) may be removed from the process disk 382.

The rotary feedthrough according to the invention (e.g., feedthroughs 300 and 392 of FIGS. 3 and 4, respectively), may be of any form which provides fluid communication between cooling gas chambers in a stationary housing and a rotating shaft such that a cooling gas may be circulated there through (e.g., first gas chambers 264 and 354, and second gas chambers 276 and 374). In accordance with another aspect of the invention, the rotary feedthrough may comprise one or more magnetic seals, as illustrated and described in greater detail hereinafter.

Figures 5A, 5B:
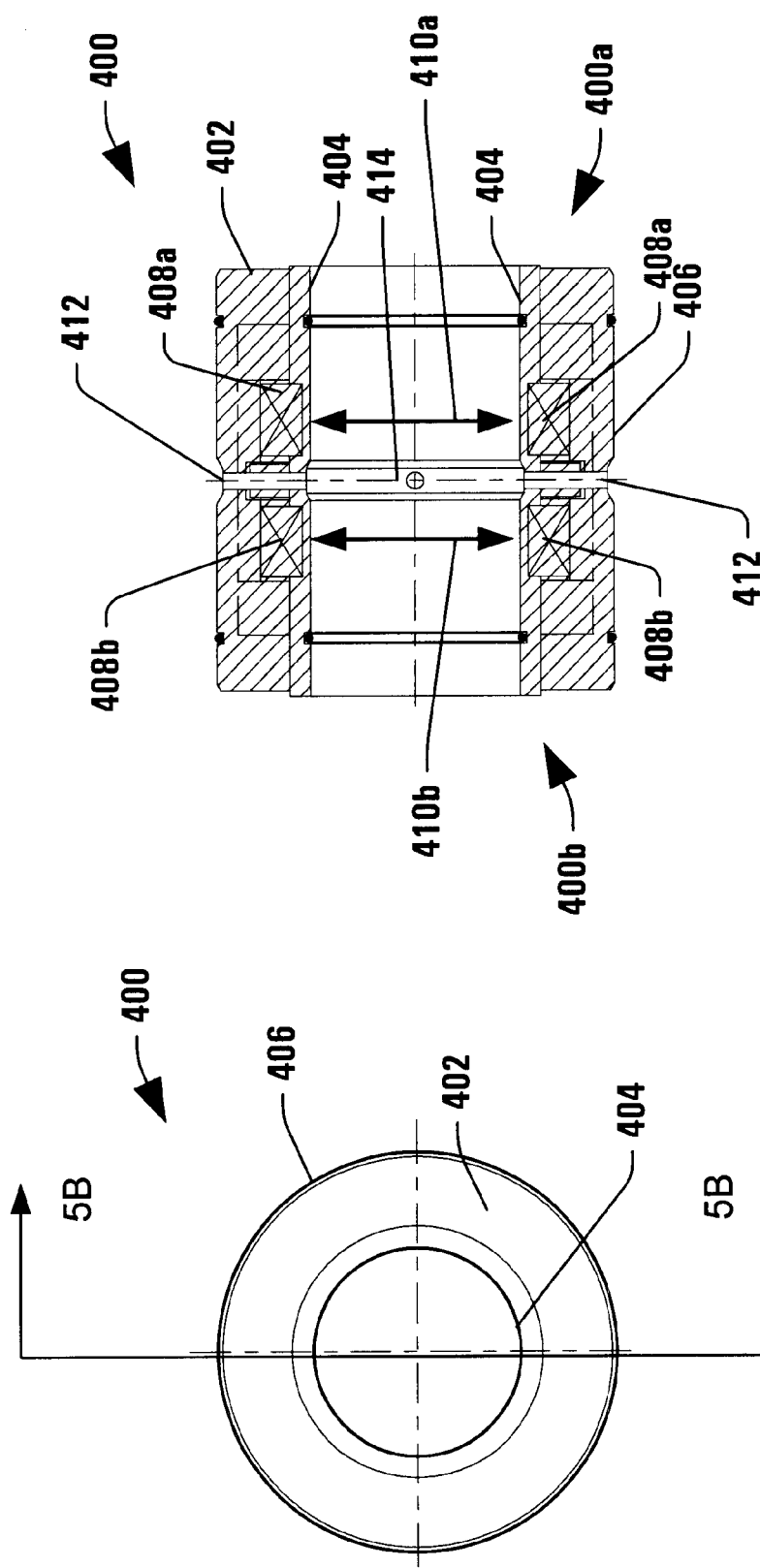
FIG. 5A is an end elevation view illustrating an exemplary seal in accordance with another aspect of the invention.
FIG. 5B is a sectional side elevation view illustrating the exemplary seal taken along line 5B—5B of FIG. 5A.

Referring now to FIGS. 5A and 5B, an exemplary rotary feedthrough 400 is illustrated comprising a cylindrical member 402 having an inner surface 404 which may be disposed radially outwardly of and encircling a shaft (e.g., shafts 270 and 364 of FIGS. 3 and 4, respectively) to form a gap (not shown) there between, and an outer surface 406 adapted for mounting on an inner surface of a housing (e.g., surfaces 260 and 362 of housings 254 and 352, respectively). A pair of magnets 408a and 408b form a magnetic circuit with a shaft along lines 410a and 410b, and a magnetic fluid (e.g., ferro fluid, not shown) fills a portion of the gap between the cylindrical member inner surface 404 and the shaft. The magnetic fluid thus provides a seal between the interior cavity of a housing and the first and second gas chambers (e.g., chambers 264 and 276 of FIG. 3). Cooling gas may be provided to one or more ports 412 in the cylindrical member 402 (e.g., via outlet opening 268 in inner surface 260 of housing 254 in FIG. 3), which is then circulated along a channel 414 circumferentially disposed about a central portion of the inner surface 404 of the cylindrical member 402.

The magnetic field resulting from the magnets 408a and 408b together with the magnetic fluid, provide for a magnetic seal proximate the magnets 408a and 408b on either side of the channel 414, which provides a pressure barrier between first and second ends 400a and 400b, respectively, of the rotary feedthrough 400, and the cooling gas within the channel 414. The resulting dual seal configuration provides for a rotary feedthrough which may be advantageously employed in a batch ion implanter spindle assembly (e.g., assemblies 250 and 350 of FIGS. 3 and 4) whereby cooling gas may be provided to remove heat from workpieces being implanted, as illustrated and described above.

For example, where the interior cavity of the housing 254 of FIG. 3 comprises a first cavity end 262a proximate the first end 270a of the shaft 270, and a second cavity end 262b disposed near the second end 270b of the shaft 270, the first end 400a of the rotary feedthrough 400 may be disposed toward the first shaft end 270a with the second end 400b disposed toward the second end 270b of the shaft 270. In this regard, the exemplary rotary feedthrough 400 comprises a first seal portion (e.g., magnetic fluid along the line 410a near the first end 400a) which provides a seal between the first cavity end 262a and the first and second gas chambers 264 and 276, respectively in the gap (not shown) between the shaft 270 and the inner surface 404 of cylindrical member 402. For example, this may seal the cooling gas within the gas chambers 264 and 276 from the ambient pressure existing in the first cavity end 262a of the spindle assembly 250.

In similar fashion, the rotary feedthrough 400 may comprise a second seal portion (e.g., magnetic fluid along the line 410b near the second end 400b) which provides a seal between the second cavity end 262b and the first and second gas chambers 264 and 276, respectively in the gap (not shown) between the shaft 270 and the inner surface 404 of the cylindrical member 402. This may seal, for example, the cooling gas in the chambers 264 and 276 (e.g., which may be pressurized) from the vacuum environment in which the workpieces are implanted with ions.

Figure 6:
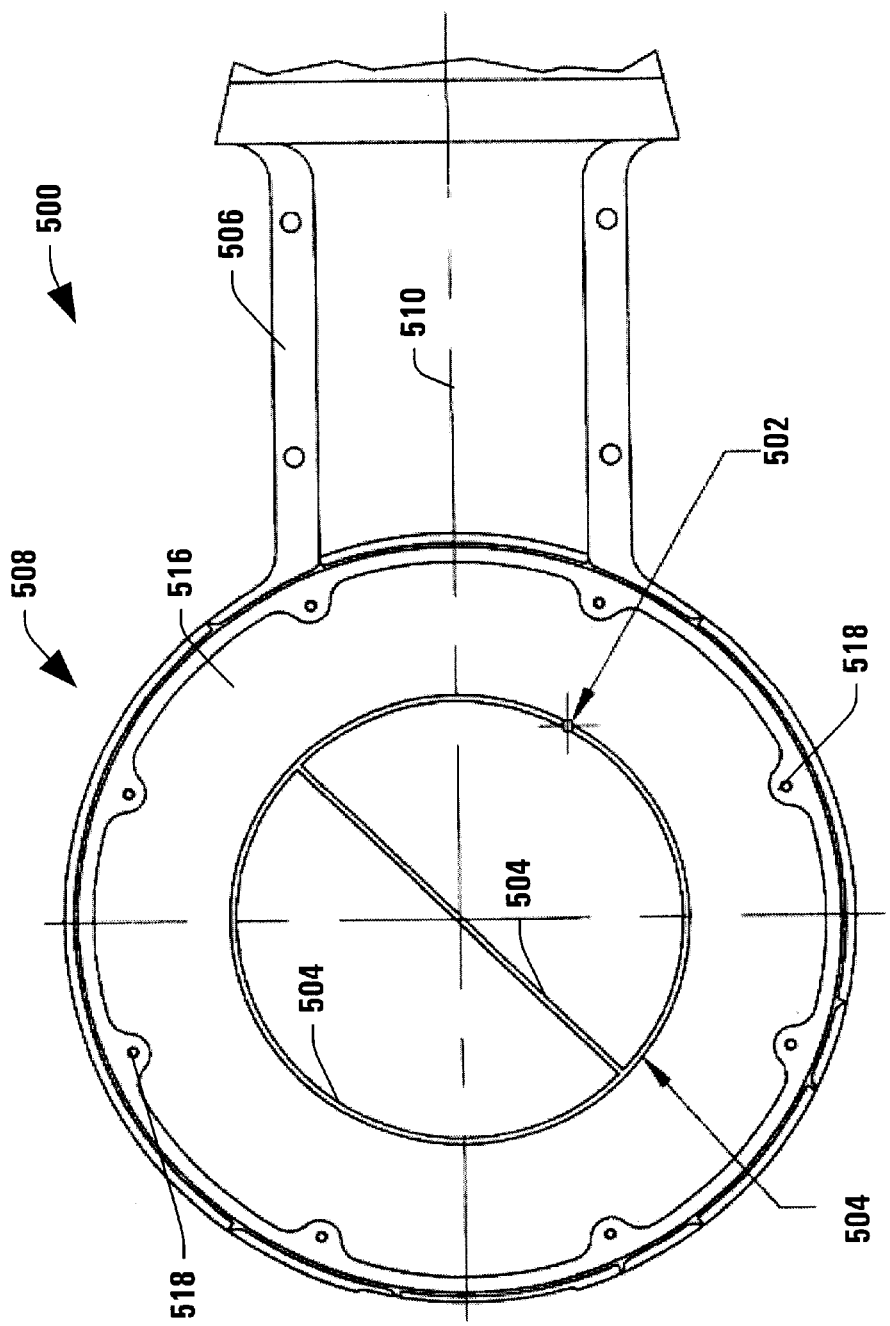
FIG. 6 is an end elevation view illustrating an exemplary wafer pedestal with a cooling gas feed port in accordance with another aspect of the invention.

Referring now to FIGS. 6, 7A, and 7B, an exemplary wafer pedestal 500 is illustrated with a cooling gas feed port 502 and a gas transfer channel 504 in accordance with another aspect of the invention. The pedestal 500 comprises an arm 506 for mounting the pedestal 500 onto a process disk center portion (e.g., center portion 284 of process disk 282 of FIG. 3) such that a workpiece mount 508 is disposed radially outwardly along line 510 from the axis of rotation (not shown) of the process disk. The pedestal 500 may include counter-bored mounting holes 512 for attachment to the process disk, as well as a gas chamber 514 through the arm 506 providing fluid communication for a cooling gas (not shown) to reach the workpiece mount 508 via the gas feed port 502. A workpiece (not shown) may be mounted on a workpiece surface 516 at a slight angle with respect to the axis (not shown) about which the process disk is rotated. The workpiece mount 508 further comprises mounting holes 518 for mounting a seal apparatus, as illustrated and described hereinafter with respect to FIGS. 8A–8D.

Figure 8B:
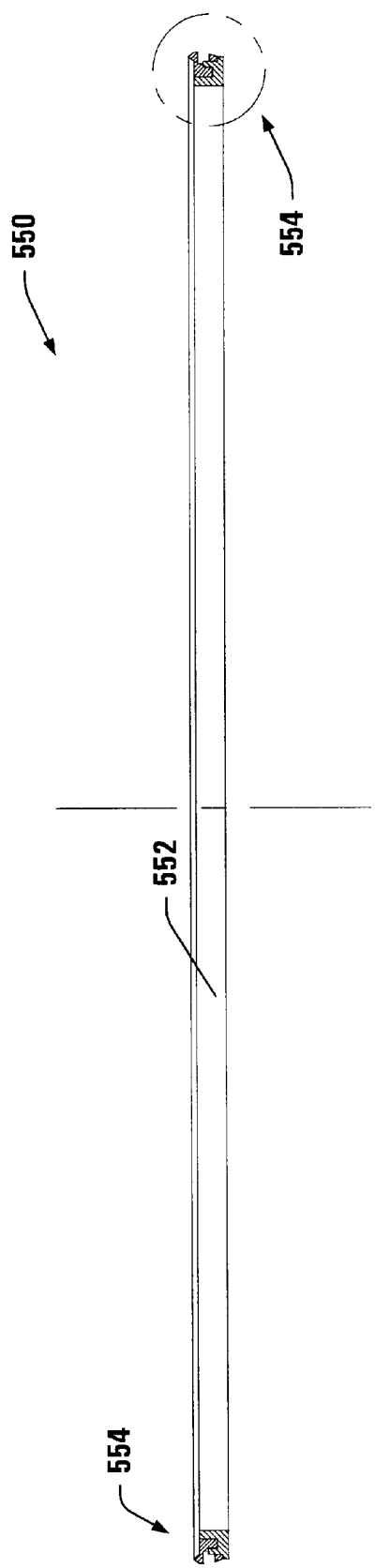
FIG. 8B is a sectional side elevation view illustrating the ring seal taken along line 8B—8B of FIG. 8A.

FIGS. 8A and 8B illustrate an exemplary seal apparatus 550 for use in a batch ion implanter with a rotatable process disk (e.g., process disk 282 of FIG. 3) having at least one workpiece mount (e.g., workpiece mount 508 of FIG. 6) adapted to support a cylindrical workpiece (not shown) having a peripheral edge in a workpiece plane, as well as to supply a cooling gas to a back side thereof in accordance with another aspect of the invention. Seal apparatus 550 comprises a ring-shaped support member 552, which may be mounted on a workpiece mount (e.g., mount 508), and a first seal member 554 mounted on the support member 552 and having a first portion 556 which is flexible with respect to the support member 552 and adapted to engage a portion of the backside of a workpiece as illustrated and described hereinafter with respect to FIG. 8D. The seal apparatus 550 may be mounted onto the workpiece mount 508 via holes 566 in mounting tabs 568 using fasteners (not shown). In this regard, the seal apparatus 550 may be detachable from the workpiece mount 508 (e.g., via mounting fasteners and the like), thus providing for ease of repair or replacement thereof.

Figure 8D:
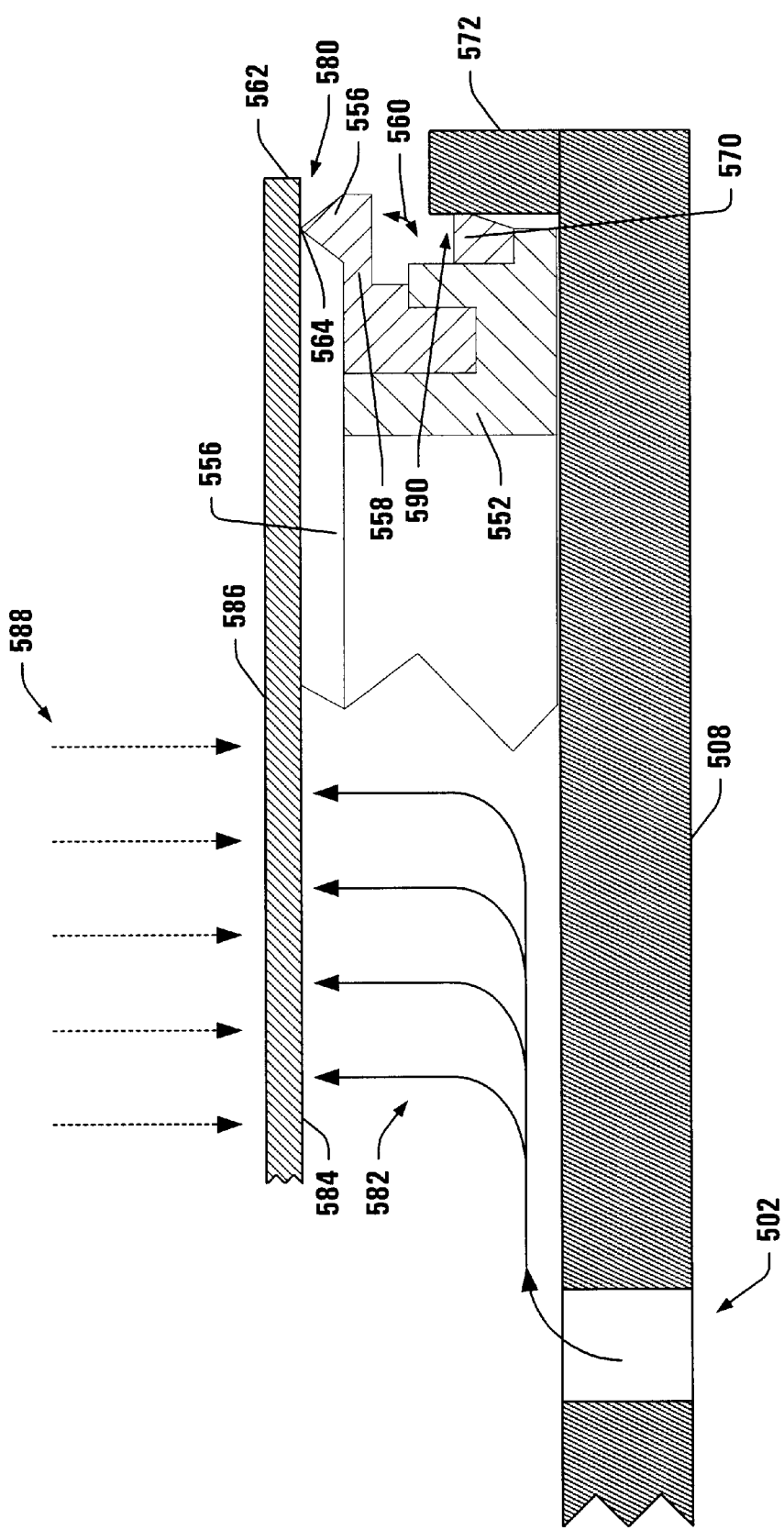
FIG. 8D is a partial side elevation view in section illustrating the exemplary ring seal of FIGS. 8A–8C engaging with a wafer workpiece.

The first portion 556 of the first seal member 554 is cantilevered radially outwardly with respect to the center of the ring-shaped support member 552 so as to pivot about a circumferential axis or pivot point 558 in a direction 560 generally perpendicular to the plane of the workpiece 562, as illustrated in FIG. 8D. The ring-shaped support member 552 and the seal member 554 may be fashioned from any suitable material, within the scope of the present invention. For example, the support member 552 may be fashion from metal, and the flexible seal member 554 may be made from an elastomer or any flexible material. In addition, the support member 552 and the first seal member 554 may be a single piece formed of any suitable material within the scope of the present invention. The first portion 556 of the first seal member 554 may comprise a rib 564 extending toward and engaging the backside of the workpiece 562 proximate a peripheral edge thereof, in order to provide sealing engagement therewith.

In accordance with another aspect of the invention, the seal apparatus 550 may further comprise a second seal member 570, as illustrated in FIGS. 8C and 8D, mounted on the support member 552 and having a radially outwardly extending rib adapted to engage a sidewall 572 of the workpiece mount 508 to provide a seal between the support member 552 and the workpiece mount sidewall 572. The ribs of the first and second seal members 554 and 570 may be, for example, v-shaped, although other profiles are possible within the scope of the invention. It will be noted at this point that the support member 552, first seal member 554, and/or the second seal member 570 may be integrally formed in a single piece, and may be fashion from any suitable material within the scope of the invention.

As illustrated in FIG. 8D, when the exemplary seal apparatus 550 is installed in a workpiece mount 508, the first seal member 556 provides a first seal 580 between the v-shaped rib 564 and a portion of the workpiece 562 near the peripheral edge thereof, whereby cooling gas 582 providing heat removal from the backside 584 of the workpiece 562 is sealed from the front side 586 of the workpiece 562 whereon ions 588 may be implanted in a vacuum. In addition, the second seal portion 570 provides a second seal between the seal apparatus 550 and the side wall 572 of the workpiece mount 508, whereby cooling gas supplied to the back side of the workpiece 562 is prevented from leaking between the radially outward end of the support member 552 and the side wall 572 of the workpiece mount 508.

Referring also to FIGS. 9A and 9B, an exemplary wafer clamp 600 is illustrated in a closed or clamped position with a pivoting engagement arm 602 engaging with the top surface 586 of the workpiece 562 (FIG. 9A), and in an open position (FIG. 9B) where the arm 602 is spaced therefrom. The clamp 600 may be provided in the workpiece mount of a process disk (e.g., mount 508 of FIGS. 7A–C and 8D) so as to provide a sealing engagement of the sealing apparatus 550 with the workpiece 562. It will be noted at this point that the angle at which the workpiece 562 is mounted in the workpiece mount 508 (and hence of the workpiece surface 516 of FIG. 6) may cause a centrifugal force when the process disk is rotated, which aids in the compression of the sealing rib 564 of the first seal member 556, and/or the deflection thereof in the direction of arrow 560 (FIG. 8D). Where it is found that the opposing force of the backside cooling gas 582 (e.g., pressurized to approximately 3–5 torr) is greater than the centrifugal force, the clamping apparatus 600 may be advantageously employed to ensure proper sealing via the seal apparatus 550.

Although the invention has been shown and described with respect to a certain applications and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention.

In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", and variants thereof are used in either the detailed description or the claims, these terms are intended to be inclusive in a manner similar to the term "comprising".

What is claimed is:

1. In a batch ion implanter with a rotatable process disk having at least one workpiece mount adapted to support a cylindrical workpiece having a peripheral edge in a plane and to supply a cooling gas to a back side thereof, a seal apparatus for sealing a front side of the wafer from the cooling gas, comprising:

a ring-shaped support member mounted on the workpiece mount; and a first seal member mounted on the support member having a first portion flexible with respect to the support member and adapted to engage a portion of the backside of the workpiece proximate the peripheral edge to seal the front side of the workpiece from the cooling gas;

wherein the first portion of the first seal member comprises a rib extending toward and engaging the backside of the workpiece proximate the peripheral edge.

2. The apparatus of claim 1, wherein the first portion of the first seal member is flexible in a direction perpendicular to the plane of the workpiece.

3. The apparatus of claim 1, wherein the first portion of the first seal member is cantilevered radially outwardly with respect to the center of the ring-shaped support member so as to pivot about a circumferential axis in a direction generally perpendicular to the plane of the workpiece.

4. The apparatus of claim 1, further comprising a second seal member mounted on the support member and having a radially outwardly extending rib adapted to engage a sidewall of the workpiece mount to provide a seal between the support member and the workpiece mount sidewall.

5. The apparatus of claim 1, wherein the rib has a v-shaped profile with a pointed edge extending toward and engaging the backside of the workpiece proximate the peripheral edge.

6. The apparatus of claim 5, wherein the first portion of the first seal member is cantilevered radially outwardly with respect to the center of the ring-shaped support member so as to pivot about a circumferential axis in a direction generally perpendicular to the plane of the workpiece.

7. The apparatus of claim 6, wherein the ring-shaped support member is detachable from the workpiece mount allowing replacement thereof in the implanter.

8. In a batch ion implanter with a rotatable process disk having at least one workpiece mount adapted to support a cylindrical workpiece having a peripheral edge in a plane and to supply a cooling gas to a back side thereof, a seal apparatus for sealing a front side of the wafer from the cooling gas, comprising:

a ring-shaped support member mounted on the workpiece mount; and a first seal member mounted on the support member having a first portion flexible with respect to the support member and adapted to engage a portion of the backside of the workpiece proximate the peripheral edge to seal the front side of the workpiece from the cooling gas;

wherein the first portion of the first seal member is cantilevered radially outwardly with respect to the center of the ring-shaped support member so as to pivot about a circumferential axis in a direction generally perpendicular to the plane of the workpiece.

9. The apparatus of claim 8, wherein the ring-shaped support member is detachable from the workpiece mount allowing replacement thereof in the implanter.

10. In a batch ion implanter with a rotatable process disk having at least one workpiece mount adapted to support a cylindrical workpiece having a peripheral edge in a plane and to supply a cooling gas to a back side thereof, a seal apparatus for sealing a front side of the wafer from the cooling gas, comprising:

a ring-shaped support member mounted on the workpiece mount;

a first seal member mounted on the support member having a first seal portion flexible with respect to the support member and adapted to engage a portion of the backside of the workpiece proximate the peripheral edge to seal the front side of the workpiece from the cooling gas; and a second seal member mounted on the support member and having a radially outwardly extending rib adapted to engage a sidewall of the workpiece mount to provide a seal between the support member and the workpiece mount sidewall.

11. The apparatus of claim 10, wherein the first portion of the first seal member is flexible in a direction perpendicular to the plane of the workpiece.

12. The apparatus of claim 11, wherein the first portion of the first seal member is cantilevered radially outwardly with respect to the center of the ring-shaped support member so as to pivot about a circumferential axis in a direction generally perpendicular to the plane of the workpiece.

13. The apparatus of claim 10, wherein the first portion of the first seal member comprises a rib extending toward and engaging the backside of the workpiece proximate the peripheral edge.

14. The apparatus of claim 13, wherein the rib has a v-shaped profile with a pointed edge extending toward and engaging the backside of the workpiece proximate the peripheral edge.

15. The apparatus of claim 14, wherein the first portion of the first seal member is cantilevered radially outwardly with respect to the center of the ring-shaped support member so as to pivot about a circumferential axis in a direction generally perpendicular to the plane of the workpiece.

16. The apparatus of claim 15, wherein the ring-shaped support member is detachable from the workpiece mount allowing replacement thereof in the implanter.

17. A batch ion implanter process disk pedestal for supporting a cylindrical workpiece having a peripheral edge on a rotatable process disk, comprising:

at least one workpiece mount adapted to support the workpiece in a plane;

a gas feed port adapted to supply a cooling gas to a back side of the workpiece;

a ring-shaped support member mounted on the at least one workpiece mount;

a first seal member mounted on the support member having a first portion flexible with respect to the support member and adapted to engage a portion of the backside of the workpiece proximate the peripheral edge to seal the front side of the workpiece from the cooling gas; and a second seal member mounted on the support member and having a radially outwardly extending rib adapted to engage a sidewall of the workpiece mount to provide a seal between the support member and the workpiece mount sidewall.

18. The pedestal of claim 17, wherein the ring-shaped support member is detachable from the workpiece mount allowing replacement thereof in the pedestal.

19. The pedestal of claim 17, wherein the first portion of the first seal member is flexible in a direction perpendicular to the plane of the workpiece.

20. A batch ion implanter process disk pedestal for supporting a cylindrical workpiece having a peripheral edge on a rotatable process disk, comprising:

at least one workpiece mount adapted to support the workpiece in a plane;

a gas feed port adapted to supply a cooling gas to a back side of the workpiece;

a ring-shaped support member mounted on the at least one workpiece mount; and a first seal member mounted on the support member having a first portion flexible with respect to the support member and adapted to engage a portion of the backside of the workpiece proximate the peripheral edge to seal the front side of the workpiece from the cooling gas;

wherein the first portion of the first seal member is flexible in a direction perpendicular to the plane of the workpiece, and wherein the first portion of the first seal member is cantilevered radially outwardly with respect to the center of the ring-shaped support member so as to pivot about a circumferential axis in a direction generally perpendicular to the plane of the workpiece.

21. A method of securing a workpiece to a process disk, comprising:

mounting a ring seal to the process disk using at least one fastener;

supporting the workpiece on the ring seal; and providing a seal between the workpiece and the process disk using the ring seal;

wherein the ring seal comprises a first seal member and a second seal member and wherein providing a seal between the workpiece and the process disk using the ring seal comprises providing sealing engagement of the first seal member with the workpiece and providing sealing engagement of the second seal member with the process disk.

* * * * *